US011942148B2

(12) United States Patent
Flynn et al.

(10) Patent No.: US 11,942,148 B2
(45) Date of Patent: Mar. 26, 2024

(54) MIXED-SIGNAL INTERFACE CIRCUIT FOR NON-VOLATILE MEMORY CROSSBAR ARRAY

(71) Applicant: THE REGENTS OF THE UNIVERSITY OF MICHIGAN, Ann Arbor, MI (US)

(72) Inventors: Michael Flynn, Ann Arbor, MI (US); Seungjong Lee, Ann Arbor, MI (US); Seungheun Song, Ann Arbor, MI (US); Justin Correll, Ann Arbor, MI (US)

(73) Assignee: THE REGENTS OF THE UNIVERSITY OF MICHIGAN, Ann Arbor, MI (US)

( * ) Notice: Subject to any disclaimer, the term of this patent is extended or adjusted under 35 U.S.C. 154(b) by 167 days.

(21) Appl. No.: 17/727,210

(22) Filed: Apr. 22, 2022

(65) Prior Publication Data
US 2022/0343976 A1    Oct. 27, 2022

Related U.S. Application Data

(60) Provisional application No. 63/178,943, filed on Apr. 23, 2021.

(51) Int. Cl.
*G11C 13/00*    (2006.01)
*G06F 7/523*    (2006.01)

(52) U.S. Cl.
CPC .......... *G11C 13/0026* (2013.01); *G06F 7/523* (2013.01); *G11C 13/004* (2013.01); *G11C 13/0069* (2013.01)

(58) Field of Classification Search
CPC .............. G11C 13/0026; G11C 13/004; G11C 13/0069; G06F 7/523
USPC ..................................................... 365/189.16
See application file for complete search history.

(56) References Cited

U.S. PATENT DOCUMENTS

| | | | |
|---|---|---|---|
| 8,766,234 B1 | 7/2014 | Hashim et al. | |
| 8,780,613 B1 | 7/2014 | Perner | |
| 9,620,206 B2 | 4/2017 | Nazarian et al. | |
| 10,181,349 B2 | 1/2019 | Ge et al. | |
| 11,200,929 B1* | 12/2021 | Van Vaerenbergh | ... G11C 11/42 |
| 2004/0010536 A1* | 1/2004 | Moreno | ...... G06F 7/53 708/625 |
| 2014/0156921 A1 | 6/2014 | Schuette et al. | |
| 2020/0020393 A1* | 1/2020 | Al-Shamma | ........... G11C 16/26 |

(Continued)

FOREIGN PATENT DOCUMENTS

KR    20170116041 A    10/2017

*Primary Examiner* — Ly D Pham
(74) *Attorney, Agent, or Firm* — Harness, Dickey & Pierce, P.L.C.

(57) ABSTRACT

Crossbar arrays perform analog vector-matrix multiplication naturally and provide a building block for modern computing systems. Specialized mixed-signal interface circuits are interfaced with the rows and columns of the crossbar arrays. During operation, the mixed-signal interface circuits provide high voltages for write operations and low voltages for read operations. This disclosure presents improved designs for the mixed-signal interface circuits which minimize the number of switches as well as the number level shifters.

19 Claims, 4 Drawing Sheets

(56) References Cited

U.S. PATENT DOCUMENTS

2020/0174786 A1* 6/2020 Zhang ............... G06F 17/13
2021/0263672 A1* 8/2021 Chang .............. G06F 3/0673
2023/0104404 A1* 4/2023 Zhang ............... G06N 3/04
                                                        711/104

* cited by examiner

MIXED-SIGNAL INTERFACE CIRCUIT FOR NON-VOLATILE MEMORY CROSSBAR ARRAY

CROSS-REFERENCE TO RELATED APPLICATIONS

This application claims the benefit of U.S. Provisional Application No. 63/178,943, filed on Apr. 23, 2021. The entire disclosure of the above application is incorporated herein by reference.

FIELD

The present disclosure relates to a mixed-signal interface circuit for non-volatile memory crossbar arrays.

BACKGROUND

Machine learning or artificial intelligence (AI) tasks use neural networks to learn and then to infer. The workhorse of many types of neural networks is vector-matrix multiplication—computation between an input and weight matrix. Learning refers to the process of tuning the weight values by training the network on vast amounts of data. Inference refers to the process of presenting the network with new data for classification.

Crossbar arrays perform analog vector-matrix multiplication naturally. Each row and column of the crossbar is connected through a processing element (PE) that represents a weight in a weight matrix. Inputs are applied to the rows as voltage pulses and the resulting column currents are scaled, or multiplied, by the PEs according to physics. The total current in a column is the summation of each PE current.

Specialized mixed-signal interface circuits are interfaced with the rows and columns of the crossbar arrays. During operation, the mixed-signal interface circuits provide high voltages for write operations and low voltages for read operations. It is desirable to provide improved designs for the mixed-signal interface circuits which minimize the number of switches as well as the number level shifters.

This section provides background information related to the present disclosure which is not necessarily prior art.

SUMMARY

This section provides a general summary of the disclosure, and is not a comprehensive disclosure of its full scope or all of its features.

A computing system is presented. The computing system is comprised of an array of memory cells arranged in columns and rows, such that memory cells in each row of the array is interconnected by a respective drive line and each column of the array is interconnected by a respective bit line. Each memory cell in a given group of memory cells is configured to receive an input signal indicative of a multiplier and operates to output a product of the multiplier and the value of the bit stored in the given memory cell onto the corresponding bit line of a given memory cell, where the value of the multiplier is encoded in the input signal.

In one aspect, a plurality of drive circuits are interfaced with the array of memory cells. Each drive circuit is electrically connected to respective drive line in the array of memory cells. Each drive circuit further includes a digital-to-analog converter operating at a low voltage level and configured to perform a read operation of memory cells connected to the respective drive line; a writing subcircuit is configured deliver a write signal to the respective drive line during a write operation, where the voltage of the write signal is higher than the low voltage level; and a write enabled switch is interposed between the digital-to-analog converter and the writing subcircuit and operates to electrically isolate the digital-to-analog converter from the writing subcircuit during the write operation.

The writing subcircuit may include a transmission gate in series with another transistor, where the transmission gate receives the write signal and outputs the write signal to the respective drive line, and another transistor is electrically coupled between the output of the transmission gate and a reference voltage. The writing subcircuit may further include a level shifter circuit which operates to translate control signal for the transmission gate.

In another aspect, a plurality of column circuits are interfaced with the array of memory cells, each column circuit is electrically connected to at least one bit line and includes only one transimpedance amplifier. Each column circuit is configured to selectively receive current from one of the two bit lines, convert the current to a voltage using the transimpedance amplifier and digitize the voltage using an analog-to-digital converter. Each column circuit includes two column selector switches, each column selector switch is in series with one of the two bit lines and the transimpedance amplifier.

In some embodiments, each memory cell is further defined as a resistive random-access memory in series with a transistor. In these embodiments, each column circuit may further include a first switch and a second switch for each of the two bit lines, where the first switch is electrically coupled between the source terminal of the transistor and a programming voltage, and the second switch is electrically coupled between the source terminal of the transistor and a virtual ground.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

Corresponding reference numerals indicate corresponding parts throughout the several views of the drawings.

DETAILED DESCRIPTION

Example embodiments will now be described more fully with reference to the accompanying drawings.

Figure 1:
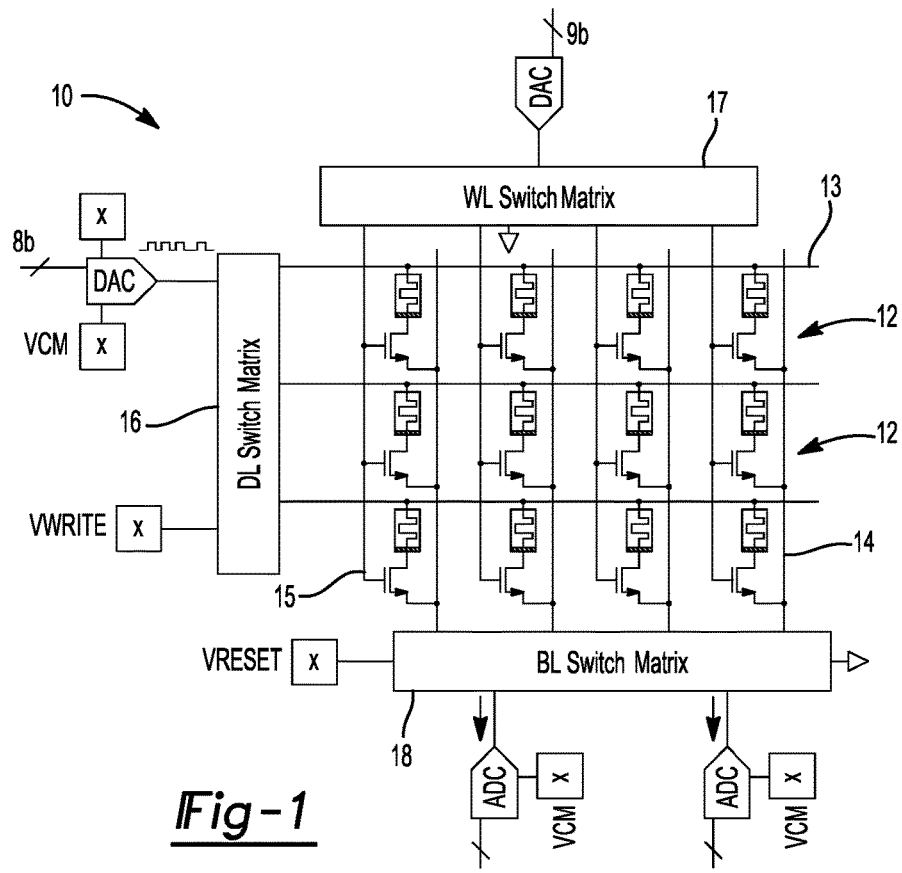
FIG. 1 is a diagram of an example implementation for a computing system.

FIG. 1 depicts an example implementation for a computing system 10. The core of the computing system is an array of memory cells 12 arranged in columns and rows and commonly referred to as a crossbar array. The memory cells 12 in each row of the array are interconnected by a respective drive line 13; whereas, the memory cells 12 in each column of the array are interconnected by a respective bit line 14. In one example embodiment, the memory cell 12 is a resistive random-access memory in series with a transistor as shown in FIG. 1. Other implementations for the memory cell are envisioned by this disclosure.

In the example embodiment, the computing system employs an analog approach where an analog value is stored in the memristor of each memory cell. In an alternative embodiment, the computing system may employ a digital approach, where a binary value is stored in the memory cells. For a binary number comprised of multiple bits, the memory cells are grouped into groups of memory cells, such that the value of each bit in the binary number is stored in a different memory cell within the group of memory cells. For example, a value for each bit in a 5 bit binary number is stored in a group of 5 adjacent columns of the array, where the value for the most significant bit is stored in memory cell on the left most column of a group and the value for the least significant bit is stored in memory cell in the right most column of a group. In this way, a multiplicand of a multiply-accumulate operation is a binary number comprised of multiple bits and stored across a one group of memory cells in the array. It is readily understood that the number of rows in a given group of memory cells may be more or less depending on the number of bits in the binary number.

During operation, each memory cell 12 in a given group of memory cells is configured to receive an input signal indicative of a multiplier and operates to output a product of the multiplier and the value stored in the given memory cell onto the corresponding bit line of a given memory cell. The value of the multiplier is encoded in the input signal.

Dedicated mixed-signal peripheral hardware is interfaced with the rows and columns of the crossbar arrays. The peripheral hardware supports read and write operations in relation to the memory cells comprising the crossbar array. Specifically, the peripheral hardware includes a drive line switch matrix 16, a wordline switch matrix 17 and a bitline switch matrix 18. Each of these hardware components is designed to minimize the number of switches and level-shifters needed for mixing high-voltage and low-voltage operation as well as to minimize the total number of switches.

Figure 2:
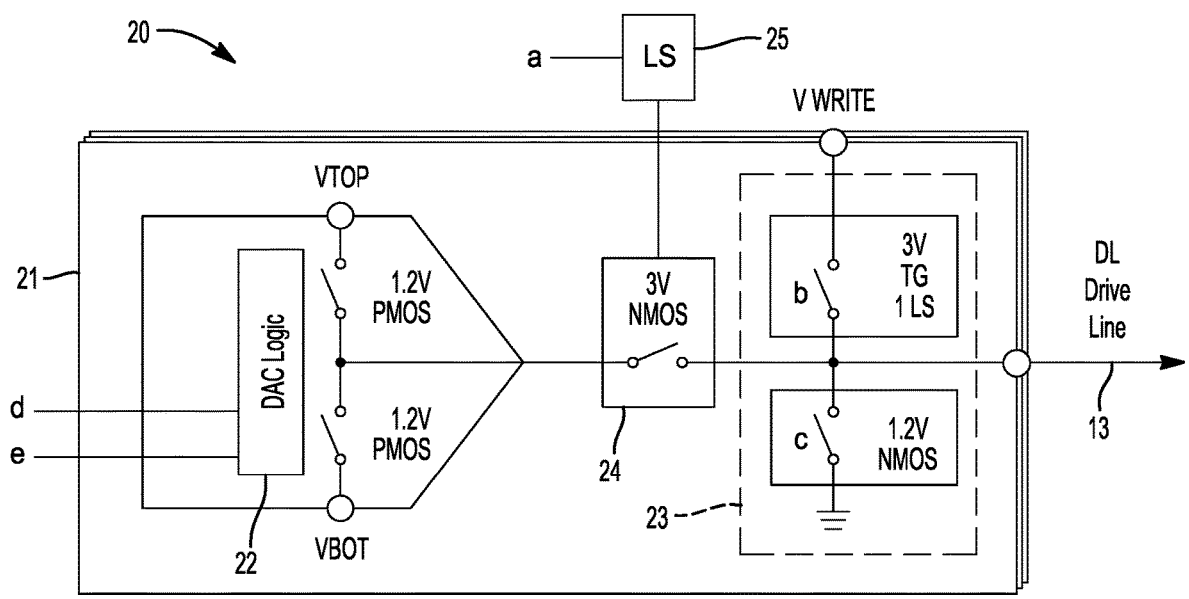
FIG. 2 is a diagram of a drive line switch matrix.

FIG. 2 further depicts the drive line switch matrix 20. The drive line switch matrix 20 includes a plurality of drive circuits 21 interfaced with the array of memory cells. More specifically, each drive circuit 21 is electrically connected to a respective drive line in the array of memory cells. A global level shifter circuit 25 is shared by the plurality of drive circuits 21.

Additionally, each drive circuit 21 is comprised of a digital-to-analog converter 22, a writing subcircuit 23 and a write enabled switch 24. The digital-to-analog converter 22 is configured to perform a read operation of memory cells connected to the respective drive line. The digital-to-analog converter 22 preferably operates at a low voltage level. During a write operation, the writing subcircuit 23 is configured to receive and deliver a write signal to the respective drive line, where voltage of the write signal is higher than the low voltage level. The write enable switch 24 is interposed between the digital-to-analog converter 22 and the writing subcircuit 23. The write enable switch 24 electrically isolates the digital-to-analog converter 22 from the writing subcircuit 23 during the write operation. The global level shifter circuit 25 is electrically coupled to the write enable switch 24 in each of the plurality of drive circuits 21. This arrangement of the write enable switch 24 allows for the use of other low voltage switches in the drive circuit 21.

Figure 3:
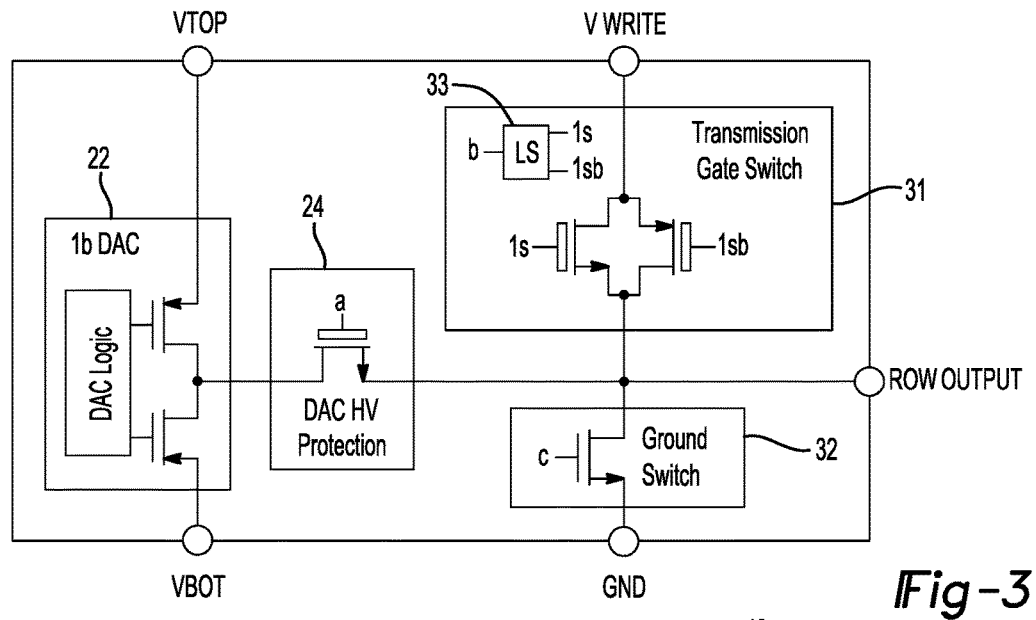
FIG. 3 is a schematic for an example embodiment of a drive line switch matrix.

An example embodiment for the drive line switch matrix 20 is further described in relation to FIG. 3. In the example embodiment, the writing subcircuit 23 is comprised of a transmission gate switch 31, a ground switch 32, and a level shifter circuit 33. The transmission gate switch 31 receives the write signal and outputs the write signal to the respective drive line. In one example, the transmission gate switch is defined by a 3.3V NMOS transistor and a 3.3V PMOS transistor. The level shifter circuit 22 translates the control signals for the transmission gate switch to a higher voltage (e.g., from 1.2 volt to 3.3 volt). The ground switch 32 is electrically coupled between the drive line and a reference voltage (i.e., system ground). In one example, the ground switch 32 is defined by a 1.2V NMOS transistor. This particular circuit arrangement is merely illustrative and other arrangements are contemplated within the broader aspects of this disclosure.

In the example embodiment, the digital-to-analog converter 22 is a one-bit DAC and the write enable switch 24 is a 3.3V NMOS transistor. During the read operation, the digital-to-analog converter 22 is connected to the row output, i.e., respective drive line. To do so, the write enabled switch 24 is turned on and the writing subcircuit 23 is disabled. That is, the transistors comprising transmission gate switch 31 are turned off and the ground switch 32 is turned off.

During write operations, the drive circuit 21 is designed to apply a high voltage to the row output, i.e., drive line. To do so, the transmission gate switch 31 is turned on while the ground switch 32 is turned off, thereby connecting the high voltage at VWRITE to the drive line. The write enable switch 24 is turned off to electrically isolate the digital-to-analog converter 22 during write operations.

In a similar manner, the drive circuit 21 can be used to reset the values of the memory cells connected to the drive line. To do so, the drive line is connected to ground by turning ground switch 32 on while turning the transmission gate switch 31 off. Again, the write enable switch 24 is turned off to electrically isolate the digital-to-analog converter 22 during reset operations.

Figure 4:
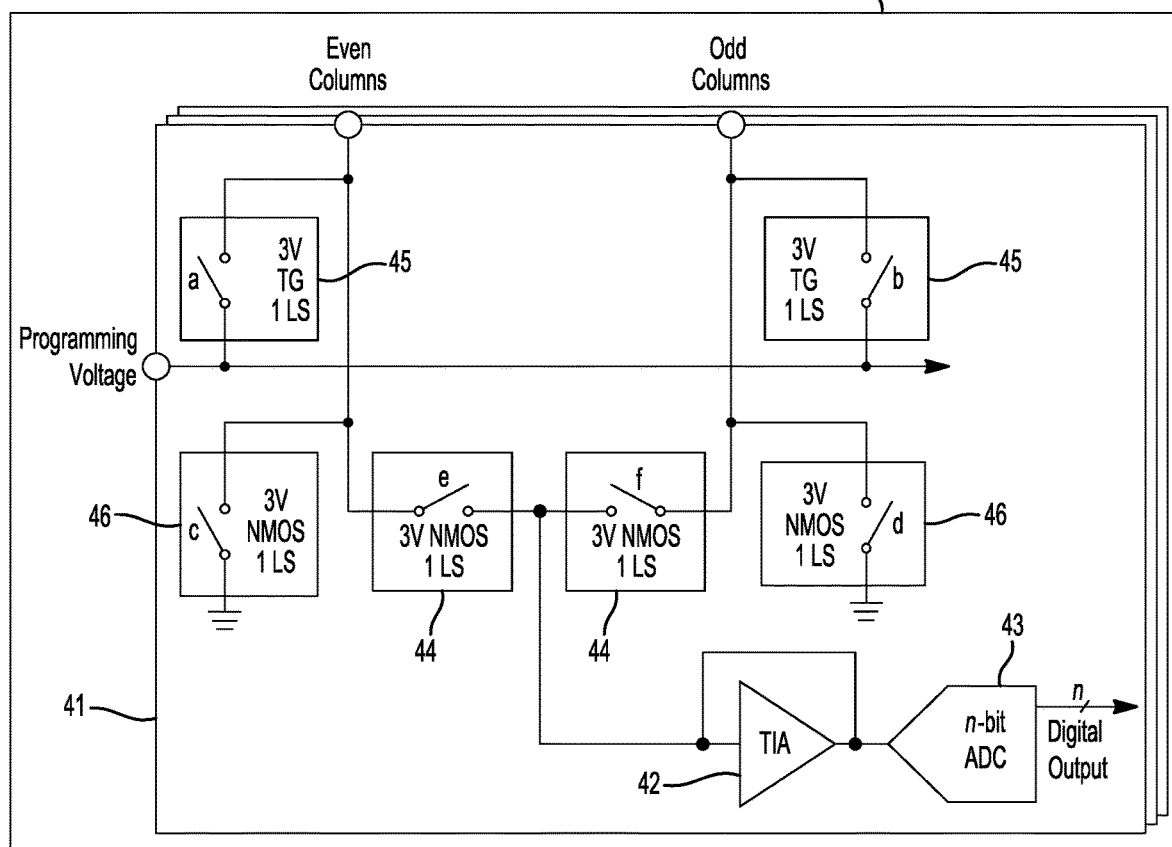
FIG. 4 is a diagram of a bitline switch matrix.

FIG. 4 further depicts the bitline switch matrix 40. The bitline switch matrix includes a plurality of column circuits 41 interfaced with the array of memory cells. More specifically, each column circuit 41 is electrically connected to two bit lines. Of note, each column circuit 41 includes only one transimpedance amplifier 42 and one analog-to-digital converter 43 which are shared by the two bit lines, thereby reducing the number of these components by half. The column circuit 41 functions to selectively receive current from one of the two bit lines, convert the current to a voltage using the transimpedance amplifier 42 and digitize the voltage using the analog-to-digital converter 43. While each column circuit 41 is shared amongst two bit lines in the example embodiment, it is envisioned that a column circuit could be among any number of bitlines in other embodiments. In yet other embodiments, a column circuit 41 is connected to only one bit line. That is, the column circuits do not need to be shared amongst bit lines.

The column circuit 41 further includes two column selector switches 44. Each column selector switch 44 is in series with one of the two bit lines and the transimpedance amplifier 42. One of the two column selector switches 44 is enabled while the other of the two column selector switches 44 is disabled to thereby couple one of the two bitlines to the transimpedance amplifier 42. The column circuit 41 also include two additional switches 45, 46 for each bit line. In the example embodiment, the transmission gate switch 45 is electrically coupled between source terminal of the transistors in the memory cells coupled to a respective bit line and a programming voltage, and the ground switch 46 is electrically coupled between the source terminal of the transistor in the memory cells coupled to a respective bit line and system ground. In other embodiments, memory cell may be implemented by a resistive random-access memory only such that the transmission gate switch is electrically coupled to the resistor of the memory cell.

Figure 5:
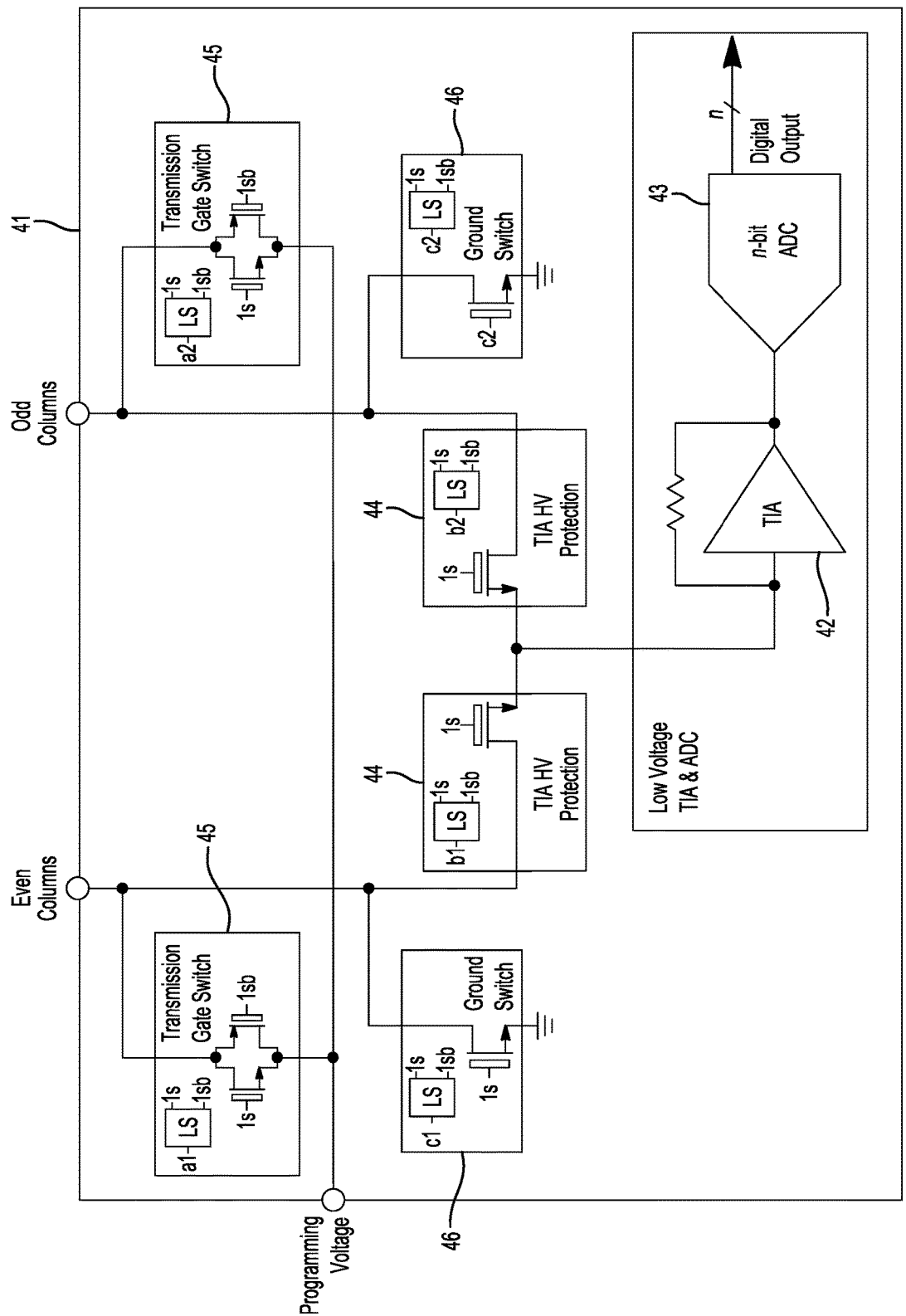
FIG. 5 is schematic for an example embodiment of the bitline switch matrix.

An example embodiment for the bitline switch matrix 40 is further described in relation to FIG. 5. In the example embodiment, a column selector switch 44 is implemented by a 3.3V NMOS transistor along with a level shifter circuit, where the level shifter circuit converts the controls signals applied to the gate of the NMOS transistor to a higher voltage (e.g., 3.3 volt). The transmission gate switch 45 is implemented by a 3.3V NMOS transistor and a 3.3V PMOS transistor with another level shifter circuit serving to raise the voltage of the control signals applied gates of the transistors. Lastly, the ground switch 46 is implemented by a 3.3V NMOS transistor with yet another level shifter circuit serving to raise the voltage of the control signal applied to the gate of this transistor. This particular circuit arrangement is merely illustrative and other arrangements are contemplate within the broader aspects of this disclosure.

During write operations, the drive circuit 21 is designed to apply high voltage to select drive lines while the active column is pulled to ground by column circuits 41. To do so, the column selector switches 44 are both disabled as well as the transmission gate switches 45 are both disabled. The ground switch 46 of the selected column is enabled to thereby couple the active bit line to ground; whereas, the ground switch 46 of the unselected column is disabled.

During reset operations, the drive circuit 21 is designed to ground the selected drive line while high voltage is applied to the active column by the column circuits 41. In this case, the column selector switches 44 are both disabled to protect the low voltage read circuitry and the ground switches 45 are both disabled. The transmission gate switch 45 of the selected column is enabled which is coupled to the programming voltage. The transmission gate switch 45 of the unselected column is disabled.

During read operations, the columns circuits 41 are designed to connect the active columns via the transimpedance amplifier 42 to the analog-to-digital converter 43. The column selector switch 44 for the active column is enabled while the column selector switch 44 for the inactive column is disabled. The two column selector switches can be toggled between their two states to perform read operations on both columns. The transmission gate switches 45 are both disabled and the ground switches 46 are both disabled.

Figure 6:
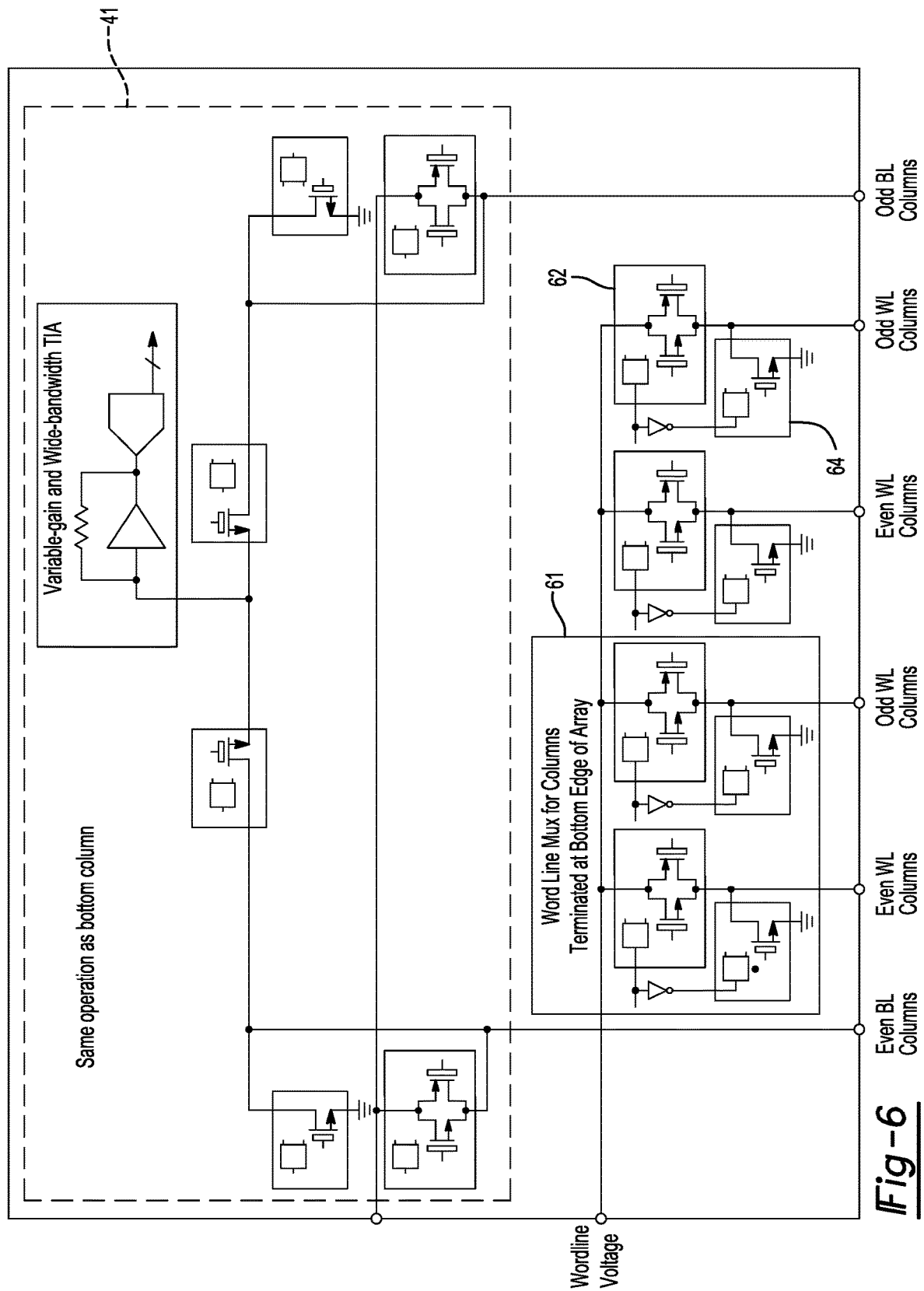
FIG. 6 is a schematic for an example embodiment of a wordline switch matrix.

All of the wordlines are connected column wise to the transistors comprising the memory cells as seen in FIG. 1. FIG. 6 further depicts the wordline switch matrix 17, where the wordline switch matrix 17 includes a plurality of wordline circuits 61 interfaced with the array of memory cells. More specifically, each wordline circuit 61 is electrically coupled to the wordline voltage. Each wordline circuit 61 includes a transmission gate switch 62 and a ground switch 64. The transmission gate switch 62 is implemented by a 3.3V NMOS transistor and a 3.3V PMOS transistor with a level shifter circuit serving to raise the voltage of the control signals applied gates of the transistors. The ground switch 64 is implemented by a 3.3V NMOS transistor with another level shifter circuit serving to raise the voltage of the control signal applied to the gate of the transistor.

During write operations, the wordline circuit 61 is designed to turn on select columns. That is, the transmission gate switches 62 for selected columns are enabled. In either write operation (i.e., set mode or reset mode), a single channel wordline switch is decoded and connected to the wordline voltage.

During read operations, all of the even wordlines or the odd wordlines are turned on to activate the corresponding even columns or odd columns. That is, in even mode, all of the transmission gate switches 62 in the even columns are activated; whereas, in the odd mode, all of the transmission gate switches 62 in odd columns are activated.

FIG. 6 also shows a column circuit 41 of the bitline switch matrix 40. In some embodiments, the circuits for the bitline switch matrix are arranged below the array of memory cells as seen in FIGS. 1 and 5. In this alternative embodiment, some portion of the column circuits 41 from the bitline switch matrix 40 are arranged above the array of memory cells as seen in FIG. 6. For example, half of the column circuits 41 are arranged above the array of memory cells while the remainder of the column circuits 41 are arranged below the array of memory cells. In this way, the circuit arrangement is better able to meet column pitch requirements of the memory array.

Each row and column of the crossbar array is connected to various groups of analog switches. Grouped by function, the specific state of the switches is decoded with a four function address decoder. In the example embodiment, the decoder provides the following states: all on, all off, active high select and active low select. The decoder is configured by a computer processor or an automated timing controller.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A computing system, comprising:
an array of memory cells arranged in columns and rows, such that memory cells in each row of the array is interconnected by a respective drive line and each column of the array is interconnected by a respective bit line;
each memory cell in a given group of memory cells is configured to receive an input signal indicative of a multiplier and operates to output a product of the multiplier and the value of the bit stored in the given memory cell onto the corresponding bit line of a given memory cell, where the value of the multiplier is encoded in the input signal; and
a plurality of drive circuits interfaced with the array of memory cells, each drive circuit is electrically connected to respective drive line in the array of memory cells and includes
a digital-to-analog converter operating at a low voltage level and configured to perform a read operation of memory cells connected to the respective drive line;

a writing subcircuit is configured to receive and operates to deliver a write signal to the respective drive line during a write operation, where voltage of the write signal is higher than the low voltage level; and a write enabled switch is interposed between the digital-to-analog converter and the writing subcircuit and operates to electrically isolate the digital-to-analog converter from the writing subcircuit during the write operation.

2. The computing system of claim 1 further comprises a global level shifter circuit shared by the plurality of drive circuits and electrically coupled to the write enabled switch in each of the plurality of drive circuits.

3. The computing system of claim 1 wherein the writing subcircuit includes a transmission gate in series with another transistor, where the transmission gate receives the write signal and outputs the write signal to the respective drive line, and the another transistor is electrically coupled between output of the transmission gate and a reference voltage.

4. The computing system of claim 1 wherein the writing subcircuit further includes a level shifter circuit which operates to translate control signal for the transmission gate.

5. The computing system of claim 1 further comprises a plurality of column circuits interfaced with the array of memory cells, each column circuit is electrically connected to at least one bit line and includes only one transimpedance amplifier.

6. The computing system of claim 5 wherein each column circuit is configured to selectively receive current from one of the two bit lines, convert the current to a voltage using the transimpedance amplifier and digitize the voltage using an analog-to-digital converter.

7. The computing system of claim 5 wherein each column circuit includes two column selector switches, each column selector switch is in series with one of the two bit lines and the transimpedance amplifier.

8. The computing system of claim 7 wherein each memory cell is further defined as a resistive random-access memory in series with a transistor.

9. The computing system of claim 8 wherein each column circuit further includes a first switch and a second switch for each of the two bit lines, where the first switch is electrically coupled between source terminal of the transistor and a programming voltage, and the second switch is electrically coupled between the source terminal of the transistor and a system ground.

10. A computing system, comprising:
an array of memory cells arranged in columns and rows, such that memory cells in each row of the array is interconnected by a respective drive line and each column of the array is interconnected by a respective bit line;

each memory cell in a given group of memory cells is configured to receive an input signal indicative of a multiplier and operates to output a product of the multiplier and the value of the bit stored in the given memory cell onto the corresponding bit line of a given memory cell, where the value of the multiplier is encoded in the input signal;

a plurality of drive circuits interfaced with the array of memory cells, each drive circuit is electrically connected to respective drive line in the array of memory cells; and a plurality of column circuits interfaced with the array of memory cells, each column circuit is electrically connected to at least one bit line and includes only one transimpedance amplifier.

11. The computer system of claim 10 wherein each drive circuit includes
a digital-to-analog converter operating at a low voltage level and configured to perform a read operation of memory cells connected to the respective drive line;

a writing subcircuit is configured to receive and operates to deliver a write signal to the respective drive line during a write operation, where voltage of the write signal is higher than the low voltage level; and a write enabled switch is interposed between the digital-to-analog converter and the writing subcircuit and operates to electrically isolate the digital-to-analog converter from the writing subcircuit during the write operation.

12. The computing system of claim 11 further comprises a global level shifter circuit shared by the plurality of drive circuits and electrically coupled to the write enabled switch in each of the plurality of drive circuits.

13. The computing system of claim 11 wherein the writing subcircuit includes a transmission gate in series with another transistor, where the transmission gate receives the write signal and outputs the write signal to the respective drive line, and the another transistor is electrically coupled between output of the transmission gate and a reference voltage.

14. The computing system of claim 11 wherein the writing subcircuit further includes a level shifter circuit which operates to translate control signal for the transmission gate.

15. The computing system of claim 10 wherein each column circuit is configured to selectively receive current from one of the two bit lines, convert the current to a voltage using the transimpedance amplifier and digitize the voltage using an analog-to-digital converter.

16. The computing system of claim 10 wherein each column circuit includes two column selector switches, each column selector switch is in series with one of the two bit lines and the transimpedance amplifier.

17. The computing system of claim 16 wherein each memory cell is further defined as a resistive random-access memory in series with a transistor.

18. The computing system of claim 17 wherein each column circuit further includes a first switch and a second switch for each of the two bit lines, where the first switch is electrically coupled between source terminal of the transistor and a programming voltage, and the second switch is electrically coupled between the source terminal of the transistor and a system ground.

19. A computing system, comprising:
an array of memory cells arranged in columns and rows, such that memory cells in each row of the array is interconnected by a respective drive line and each column of the array is interconnected by a respective bit line;

each memory cell in a given group of memory cells is configured to receive an input signal indicative of a multiplier and operates to output a product of the multiplier and the value of the bit stored in the given memory cell onto the corresponding bit line of a given memory cell, where the value of the multiplier is encoded in the input signal; and a plurality of drive circuits interfaced with the array of memory cells, each drive circuit is electrically connected to respective drive line in the array of memory cells;

a global level shifter circuit shared by the plurality of drive circuits;

each drive circuit includes a digital-to-analog converter operating at a low voltage level and configured to perform a read operation of memory cells connected to the respective drive line;

a writing subcircuit is configured to receive and operates to deliver a write signal to the respective drive line during a write operation and is disabled during the read operation, where voltage of the write signal is higher than the low voltage level; and a write enabled switch is interposed between the digital-to-analog converter and the writing subcircuit and operates to electrically isolate the digital-to-analog converter from the writing subcircuit during the write operation and is turned on during the read operation.

* * * * *